(12) United States Patent
Sakaguchi et al.

(10) Patent No.: US 8,227,909 B2
(45) Date of Patent: Jul. 24, 2012

(54) SEMICONDUCTOR PACKAGE AND METHOD OF MANUFACTURING THE SAME

(75) Inventors: Hideaki Sakaguchi, Nagano (JP); Mitsutoshi Higashi, Nagano (JP); Yuichi Taguchi, Nagano (JP); Akinori Shiraishi, Nagano (JP); Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 7 days.

(21) Appl. No.: 12/969,952

(22) Filed: Dec. 16, 2010

(65) Prior Publication Data

US 2011/0156242 A1  Jun. 30, 2011

(30) Foreign Application Priority Data

Dec. 24, 2009  (JP) .................................. 2009-291631

(51) Int. Cl.
*H01L 23/04* (2006.01)

(52) U.S. Cl. ......... 257/698; 257/E21.499; 257/E23.012; 438/108

(58) Field of Classification Search ................... 257/698, 257/E21.499, E23.012; 438/108
See application file for complete search history.

(56) References Cited

FOREIGN PATENT DOCUMENTS

| JP | 2004-160654 | 6/2004 |
|---|---|---|
| JP | 2007-017199 | 1/2007 |
| JP | 2007-173756 | 7/2007 |

*Primary Examiner* — Zandra Smith
*Assistant Examiner* — Marvin Payen
(74) *Attorney, Agent, or Firm* — Rankin, Hill & Clark LLP (57) ABSTRACT

There is provided a method of manufacturing a semiconductor package. The method includes: (a) providing a silicon wafer comprising a first surface and a second surface opposite to the first surface; (b) forming vias through the silicon wafer in its thickness direction; (c) forming wiring patterns on the first surface of the silicon wafer such that the wiring patterns are electrically connected to the vias; (d) bonding a MEMS element wafer comprising MEMS elements onto the second surface of the silicon wafer such that the MEMS elements are electrically connected to the vias; (e) dividing the MEMS element wafer into the respective MEMS elements; (f) bonding a lid having concave portions therein onto the second surface of the silicon wafer such that the respective MEMS elements face a corresponding one of the concave portions; and (g) dicing the lid and the silicon wafer.

1 Claim, 11 Drawing Sheets

SEMICONDUCTOR PACKAGE AND METHOD OF MANUFACTURING THE SAME

This application claims priority from Japanese Patent Application No. 2009-291631, filed on Dec. 24, 2009, the entire contents of which are herein incorporated by reference.

BACKGROUND

1. Technical Field

The present invention relates to a semiconductor package and a method of manufacturing the same.

2. Related Art

As the semiconductor package, there is the product that is mounted with the micro electro mechanical systems (MEMS) element. The MEMS element has an ultra micro mechanical structure, and the semiconductor package mounted with the MEMS element is provided by sealing the MEMS element in the package. Since the MEMS element is mounted on the mounting substrate, such MEMS element must be connected electrically to the wiring patterns provided on the mounting substrate.

Also, in order to mount the MEMS element in the semiconductor package by the sealing, such a method may be applied that the MEMS element is sealed by bonding the lid to the substrate on which the MEMS element is mounted, using the adhesive agent (see e.g., JP-A-2004-160654, JP-A-2007-17199 and JP-A-2007-173756).

The MEMS element is formed by applying the very fine patterning to the silicon wafer used as the workpiece. In the manufacture of a semiconductor package mounted with the MEMS element, an effective manufacturing method capable of mounting the MEMS element in the package by sealing without fail has been demanded. The method of mounting the MEMS element by sealing hermetically such element into the package is effective in suppressing degradation of the characteristic of the MEMS element and improving reliability of the semiconductor package that is mounted with the MEMS element.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

It is an illustrative aspect of the present invention to provide a method of manufacturing a semiconductor package, capable of manufacturing a semiconductor package mounted with an MEMS element effectively without fail and with high reliability, and a semiconductor package mounted with the MEMS element.

According to one or more aspects of the invention, there is provided a method of manufacturing a semiconductor package. The method includes: (a) providing a silicon wafer comprising a first surface and a second surface opposite to the first surface; (b) forming vias through the silicon wafer in its thickness direction; (c) forming wiring patterns on the first surface of the silicon wafer such that the wiring patterns are electrically connected to the vias; (d) bonding a MEMS element wafer comprising MEMS elements onto the second surface of the silicon wafer such that the MEMS elements are electrically connected to the vias; (e) dividing the MEMS element wafer into the respective MEMS elements; (f) bonding a lid having concave portions therein onto the second surface of the silicon wafer such that the respective MEMS elements face a corresponding one of the concave portions; and (g) dicing the lid and the silicon wafer.

According to one or more aspects of the present invention, there is provided a method of manufacturing a semiconductor package. The method includes: (a) providing a silicon wafer comprising a first surface and a second surface opposite to the first surface; (b) forming vias through the silicon wafer in its thickness direction; (c) forming wiring patterns on the first surface of the silicon wafer such that the wiring patterns are electrically connected to the vias; (d) bonding a MEMS element wafer comprising MEMS elements onto the second surface of the silicon wafer such that the MEMS elements are electrically connected to the vias; (e) bonding a lid having concave portions therein onto the MEMS element wafer such that the respective MEMS elements face a corresponding one of the concave portions; and (g) dicing the lid, the MEMS element wafer and the silicon wafer.

According to one or more aspects of the present invention, there is provided a method of manufacturing a semiconductor package. The method includes: (a) providing a silicon wafer comprising a first surface and a second surface opposite to the first surface; (b) forming vias through the silicon wafer in its thickness direction; (c) forming wiring patterns on the first surface of the silicon wafer such that the wiring patterns are electrically connected to the vias; (d) bonding a MEMS element wafer comprising MEMS elements onto the second surface of the silicon wafer such that the MEMS elements are electrically connected to the vias; (e) providing a lid having concave portions therein and vent holes therethrough, each of the vent holes being in communication with a corresponding one of the concave portions; (f) bonding the lid onto the MEMS element wafer such that the respective MEMS elements face a corresponding one of the concave portions; (g) sealing the vent holes under a vacuum environment; and (h) dicing the lid, the MEMS element wafer and the silicon wafer.

According to one or more aspects of the present invention, there is provided a method of manufacturing a semiconductor package. The method includes: (a) providing a silicon wafer comprising a first surface and a second surface opposite to the first surface; (b) forming vias through the silicon wafer in its thickness direction; (c) forming wiring patterns on the first surface of the silicon wafer such that the wiring patterns are electrically connected to the vias; (d) forming posts on the second surface of the silicon wafer; (e) bonding a MEMS element wafer comprising MEMS elements onto the second surface of the silicon wafer such that the MEMS elements are electrically connected to the vias; (f) bonding protection covers onto the posts such that the respective protection covers cover a corresponding one of the respective MEMS elements; (g) forming a metal layer on the second surface of the silicon wafer and on the respective protection covers; (h) bonding a lid having concave portions therein onto the metal layer through a metal boding material, such that the respective MEMS elements face a corresponding one of the concave portions; and (i) dicing the lid, the MEMS element wafer and the silicon wafer.

According to one or more aspects of the present invention, there is provided a semiconductor package. The semiconductor package includes: a first substrate comprising a first surface and a second surface opposite to the first surface; a wiring pattern on the first surface of the first substrate; a MEMS element comprising an electrical connection region and a bonding region surrounding the electrical connection region, wherein the MEMS element is electrically connected to the wiring pattern in the electrical connection region, and the MEMS element is bonded on the second surface of the first substrate through a first bonding material in the bonding region; a second substrate having a concave portion therein and being bonded on the MEMS element through a second bonding material so as to hermetically seal the MEMS element, wherein the second bonding material is provided in the bonding region of the MEMS element; and a metal film formed on the first and second bonding materials, a side surface of the MEMS element, a side surface of the first substrate and a side surface of the second substrate.

Other aspects and advantages of the present invention will be apparent from the following description, the drawings and the claims.

DETAILED DESCRIPTION OF EXEMPLARY EMBODIMENTS

Hereinafter, exemplary embodiments of the present invention will be described with reference to the accompanying drawings. In all the drawings for the explanation of the embodiments, the members having the same functions are represented by the same reference numerals, and repeated description thereof will be omitted.

(First Embodiment)

FIGS. 1A to 1E show steps of forming a first substrate of the semiconductor package. The first substrate supports the MEMS element, and includes wiring patterns that connect electrically the MEMS element and the mounting substrate.

Figure 1A:
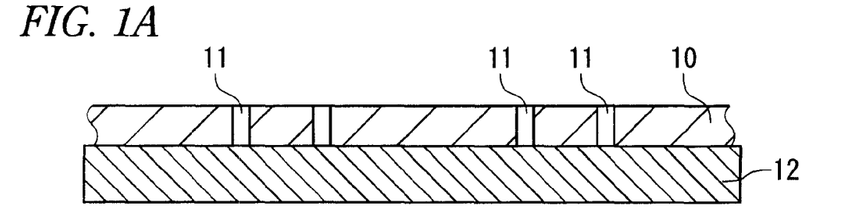
FIGS. 1A to 1E are explanatory views showing steps of manufacturing a semiconductor package according to a first embodiment.

In the present embodiment, the first substrate is formed by using a silicon wafer as a base material. FIG. 1A shows a state that a silicon wafer 10 having via holes 11 formed therethrough is supported on a supporting plate 12 such as a copper plate, or the like having a conductivity. The via holes 11 are formed by the laser beam machining, the dry etching, or the like.

Figure 1B:
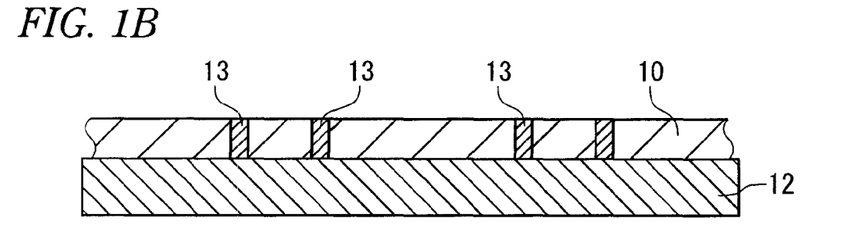
Figure 1C:
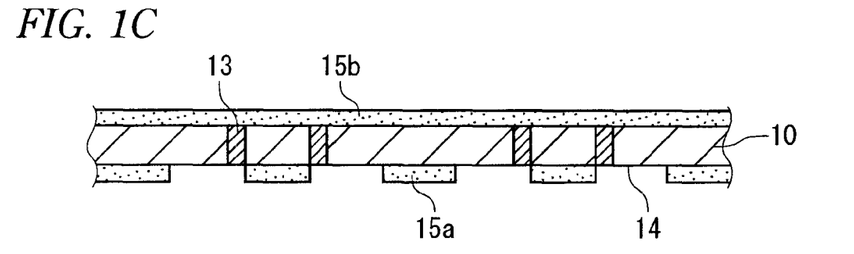
Figure 1D:
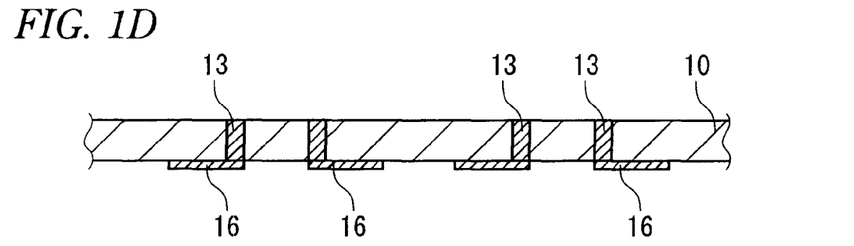
Figure 1E:
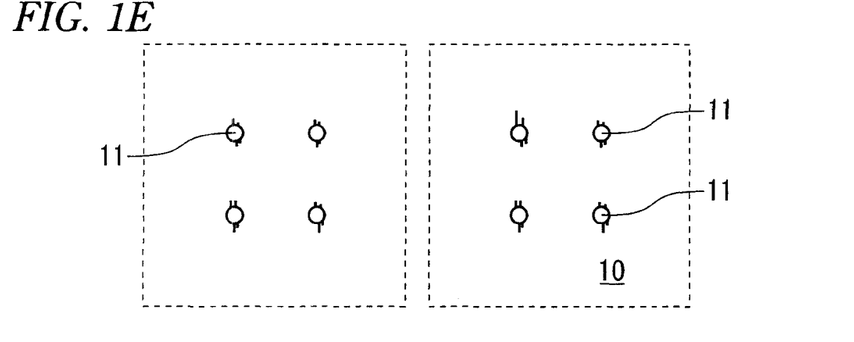

In FIG. 1E, a planar layout of the via holes 11 formed in the silicon wafer 10 is illustrated. The via holes 11 are formed in the same planar layout in respective areas that correspond to the semiconductor package individually when the silicon wafer 10 is divided into individual pieces. The areas that correspond to the semiconductor package individually are aligned in the horizontal and vertical directions.

In the illustrated example, four via holes 11 are formed in every area corresponding to one semiconductor package (area encircled by a broken line). The via holes 11 are formed to correspond to the layout of the connection electrodes provided to the MEMS element.

Then, the electrolytic copper plating is applied by using the supporting plate 12 as a plating power feeding layer, and thus the copper plating is filled in the via holes 11 to form vias 13 (FIG. 1B). The supporting plate 12 is used to support the silicon wafer 10 and used as the plating power feeding layer for applying the copper plating to the via holes 11.

After the vias 13 are formed, the supporting plate 12 is removed by the etching. In case the silicon wafer 10 itself has a certain strength, a thin conductive material such as a copper foil, or the like can be employed as the supporting plate 12.

Then, wiring patterns are formed on a surface (a lower surface in FIG. 1C) that is bonded to the mounting substrate of the silicon wafer 10. FIG. 1C shows a state that a resist pattern 15a is formed on a lower surface of the silicon wafer 10 and also an upper surface of the silicon wafer 10 is covered with a resist 15b. The resist pattern 15a is formed into such a pattern that portions in which the wiring patterns are formed are exposed from a plating seed layer 14 acting as an underlying layer. The plating seed layer 14 can be formed by the electroless plating or the sputtering.

The electrolytic copper plating is applied by using the plating seed layer 14 as a plating power feeding layer in FIG. 1C, and thus a wiring pattern 16 is formed by depositing the plating metal on the portions from which the plating seed layer 14 is exposed. FIG. 1D shows a state that the resist pattern 15a and the resist 15b are removed after the electrolytic copper plating is applied, and then the wiring pattern 16 is formed on the lower surface of the silicon wafer 10 by removing the portions from which the plating seed layer 14 is exposed.

In the present embodiment, the wiring pattern is not formed on the upper surface of the silicon wafer 10. However, in case the wiring pattern should be formed on the upper surface of the silicon wafer 10, similarly the resist pattern can be provided and the wiring pattern can be formed by the electroplating. The wiring pattern 16 is formed into a common pattern every area of the semiconductor package on the silicon wafer 10.

In this case, the wiring pattern can be formed by the appropriate method such as the additive process, the subtractive method as well as the above semi-additive process.

The vias 13 and the wiring pattern 16 are used to electrically connect the MEMS element and the mounting substrate. Both the vias 13 and the wiring pattern 16 are interpreted as the wiring pattern in a broad sense.

In the present embodiment, the first substrate is formed by using the silicon wafer because the same material as the silicon wafer used to manufacture the MEMS element is employed as the first substrate such that a thermal stress between the MEMS element and the first substrate can be suppressed as much as possible. Also, the silicon wafer is the cleaned material and is advantageous as the supporting member of the MEMS element having a mechanical moving portion, and thus a production efficiency of the semiconductor package can be improved by dividing the silicon wafer into a plurality of the semiconductor packages.

FIGS. 2A to 2E show steps of forming the individual semiconductor package by mounting the MEMS element on the silicon wafer 10 on which the vias 13 and the wiring pattern 16 are formed.

Figure 2A:
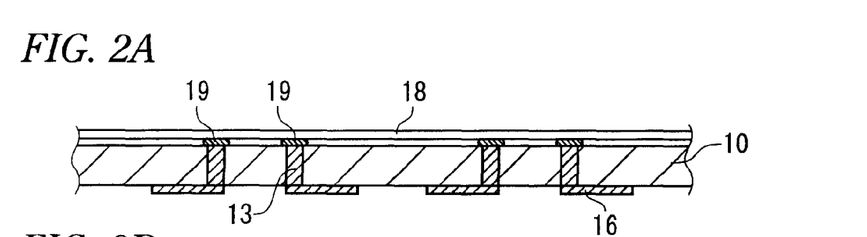
FIGS. 2A to 2E are explanatory views showing steps of manufacturing the semiconductor package according to the first embodiment.

FIG. 2A shows such a state that a MEMS element wafer 18 is bonded to the MEMS element mounting surface of the silicon wafer 10 (the step of bonding the MEMS element wafer). The MEMS element wafer 18 is formed as the wafer body in which a MEMS element 20 is formed in areas corresponding to semiconductor package forming areas on the silicon wafer 10 respectively. The MEMS element is formed in a predetermined pattern by applying the process to the silicon wafer.

Figure 3A:
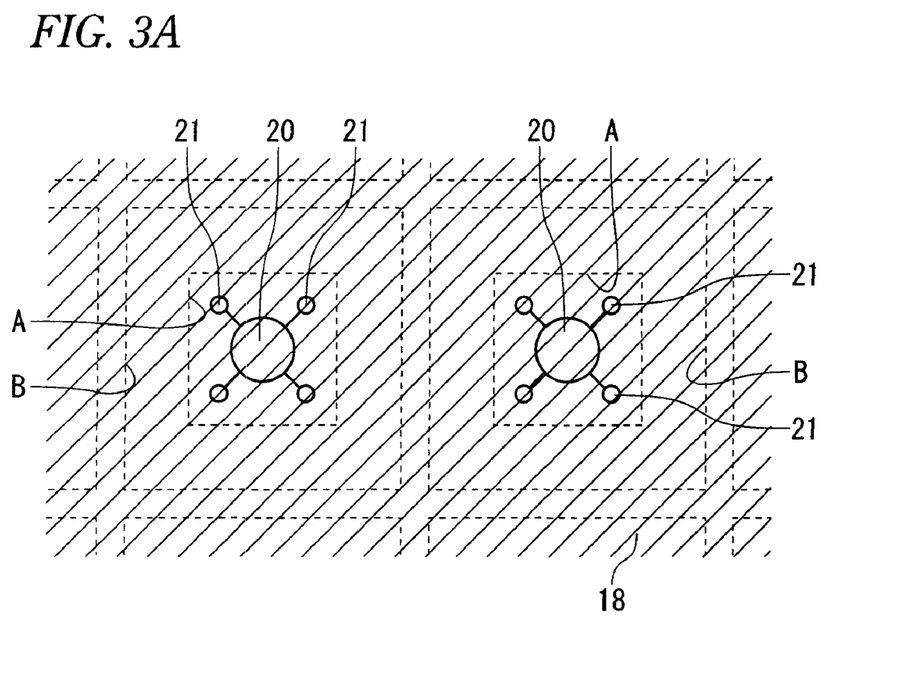
FIG. 3A is a plan view showing a state that a MEMS element wafer is bonded to a silicon wafer.

FIG. 3A shows such a state that the MEMS element wafer 18 is bonded to the upper surface of the silicon wafer 10, when viewed from the top. Connection electrodes 21 of the MEMS element 20 are arranged to coincide with planar positions of the vias 13 of the silicon wafer 10. An area A indicates an area of the respective MEMS elements 20, and an area B indicates an area of the respective semiconductor packages.

When the MEMS element wafer 18 is bonded to the silicon wafer 10, the vias 13 of the silicon wafer 10 are aligned with the connection electrodes 21 of the MEMS elements 20 formed on the MEMS element wafer 18 respectively, and then the vias 13 and the connection electrodes 21 are bonded to each other via a conductive material 19 respectively. As the conductive material 19, the solder, the conductive adhesive agent, or the like can be employed.

Figure 2B:
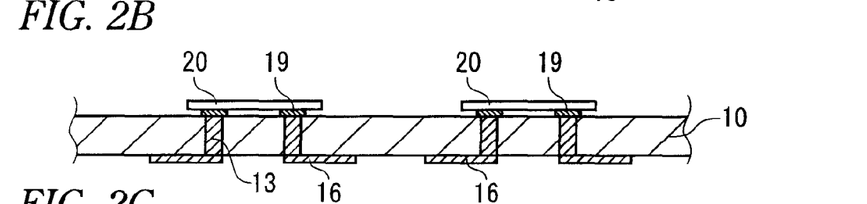

Then, FIG. 2B shows such a state that the MEMS element wafer 18 bonded to the silicon wafer 10 is separated individually, and then the MEMS elements 20 separated individually is supported on the silicon wafer 10 (the step of separating the MEMS elements individually). The MEMS elements 20 are separated individually by cutting the MEMS element wafer 18 by using a rotary blade. The MEMS element 20 as the individual piece is connected electrically to the wiring pattern 16 formed on the lower surface of the silicon wafer 10 via the conductive materials 19 and the vias 13.

Figure 2C:
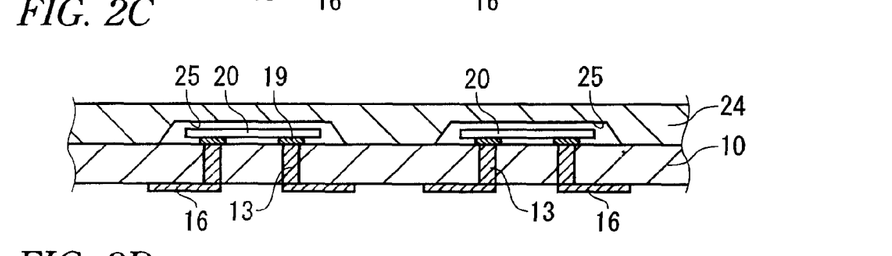

Then, FIG. 2C shows such a state that a lid 24 having concave portions 25 for housing the respective MEMS elements 20 is bonded hermetically to the MEMS element mounting surface of the silicon wafer 10 (the step of bonding the lid). The concave portion 25 formed in the lid 24 is provided not only to house the MEMS element 20 in the semiconductor package but also to secure an internal space that does not disturb an operation of the MEMS element 20. The lid 24 is bonded to the silicon wafer 10 such that the concave portions 25 are aligned with the mounting positions of the MEMS elements 20 respectively.

As the lid 24, the material such as the silicon wafer, the glass plate, or the like may be employed depending on an operation of the MEMS element 20. When the lid 24 is formed of the silicon wafer, such lid 24 can be bonded to the silicon wafer 10 by the direct bonding, the eutectic bonding, the bonding method using the metal bonding material, the resin-based adhesive agent, or the like. When the lid 24 is formed of the glass plate, such lid 24 can be bonded to the silicon wafer 10 by the anodic bonding.

When the lid 24 is formed of the silicon wafer, the method of directly bonding the lid 24 corresponds to the bonding method of forming a silicon oxide film on the surface of the wafer by heating the wafer at a high temperature. In this case, smoothness is required of the wafer surface. The eutectic bonding corresponds to the bonding method of forming the eutectic material on the bonding surface and then applying a pressure and a temperature in excess of an eutectic temperature. As the eutectic bonding, there is the Au—Si eutectic bonding, for example. The bonding method using the metal bonding material corresponds to the bonding method of using the joinable metal such as solder, indium, or the like. In this case, in order to improve the adhesion to the silicon wafer, the underlying metal layer (Ti/Cu, Cu/Ni/Au, or the like) to which the metal bonding material is adhered may be provided on the surface of the silicon wafer by the sputtering, the plating, or the like. The lid 24 can be bonded to the silicon wafer 10 via the metal bonding material without the metal layer if the metal pattern such as the connection electrode is formed on the MEMS element. When the resin-based adhesive agent is used, it is not necessary to provide the underlying metal layer. The anodic bonding used in bonding the glass plate to the silicon wafer corresponds to the bonding method of applying an electric voltage to a glass plate/silicon wafer stacked structure while heating it. In this case, the contact boundary needs to be a smooth surface.

Figure 2D:
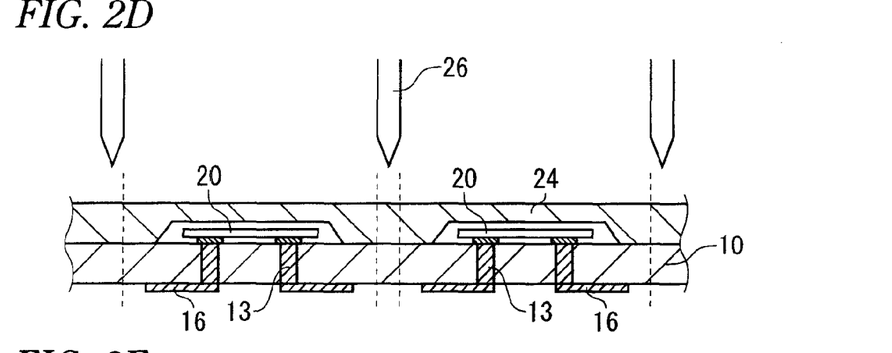
Figure 2E:
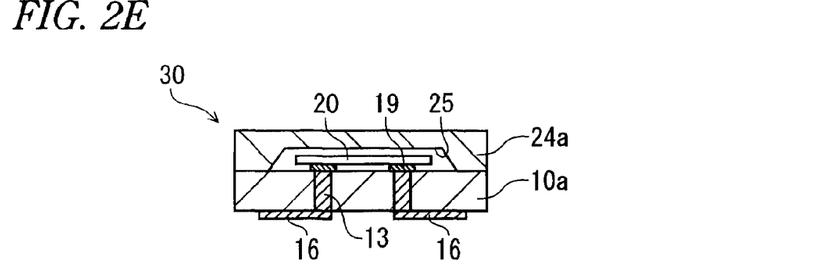

After the lid 24 is bonded to the silicon wafer 10, the semiconductor package is formed by cutting the bonded structure of the silicon wafer 10 and the lid 24 into the individual pieces (the cutting step). FIG. 2D shows such a state that the bonded structure of the silicon wafer 10 and the lid 24 is cut by a dicing blade 26. A semiconductor package 30 as a single body (FIG. 2E) is obtained by positioning the dicing blade 26 in the boundary positions between the semiconductor packages respectively and cutting the bonded structure.

The semiconductor package 30 includes a first substrate 10a formed of the silicon wafer 10, and a second substrate 24a formed of the lid 24. In the semiconductor package 30, the MEMS element 20 mounted on the first substrate 10a is housed hermetically in the concave portion 25 formed in the second substrate 24a. The MEMS element 20 is connected electrically to the wiring pattern 16 formed on the mounting surface of the first substrate 10a (the lower surface in FIG. 2E) via the vias 13.

Figure 3B:
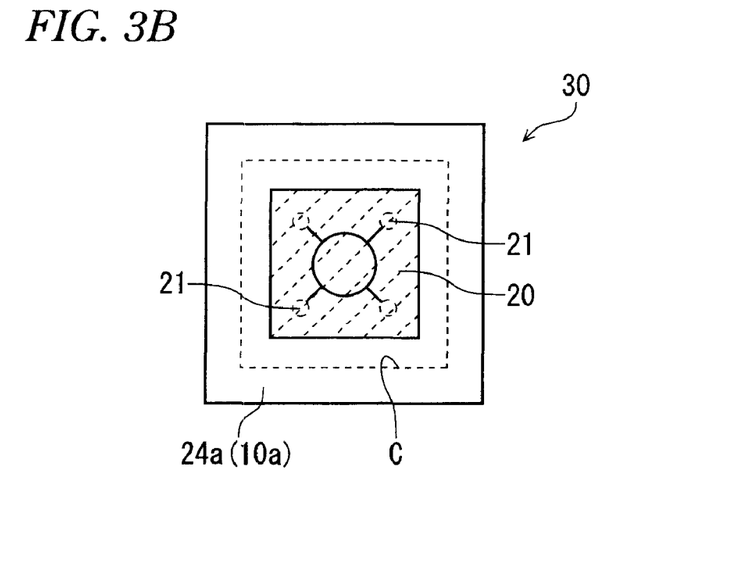
FIG. 3B is a plan view showing the semiconductor package according to the first embodiment.

FIG. 3B shows the planar layout relationship between the first substrate 10a, the second substrate 24a, and the MEMS element 20 in the semiconductor package 30. A peripheral edge position of the concave portion 25 is indicated with a broken line C.

According to the present embodiment, the semiconductor package is formed by combining the silicon wafer 10, the lid 24 and the MEMS element wafer 18, which are wafer bodies of the first substrate 10a, the second substrate 24a, and the MEMS element 20, respectively. As a result, the semiconductor package can be manufactured effectively, and the highly reliable semiconductor package in which the MEMS element 20 is sealed hermetically can be provided.

(Second Embodiment)

In the first embodiment, the MEMS element 20 is formed as an individual pieces by bonding the MEMS element wafer 18 to the silicon wafer 10 and then dicing the MEMS element wafer 18 (the step of dicing the MEMS element wafer). In the present embodiment, there is provided a method of forming the semiconductor package by using the MEMS element wafer 18 as it is without dicing process.

Figure 4A:
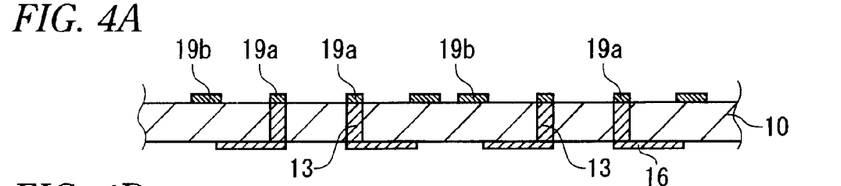
FIGS. 4A to 4F are explanatory views showing steps of manufacturing a semiconductor package according to a second embodiment.

FIG. 4A shows such a state that conductive materials 19a and metal bonding materials 19b are provided on the MEMS element mounting surface of the silicon wafer 10 in which the vias 13 and the wiring pattern 16 are formed (the step of forming the metal bonding material). The conductive material 19a is provided to connect electrically the via 13 and the connection electrode of the MEMS element 20, and is formed to coincide with the planar layout of the via 13 formed in the silicon wafer 10. The metal bonding material 19b is provided to bond the MEMS element wafer 18 to the silicon wafer 10.

Figure 5A:
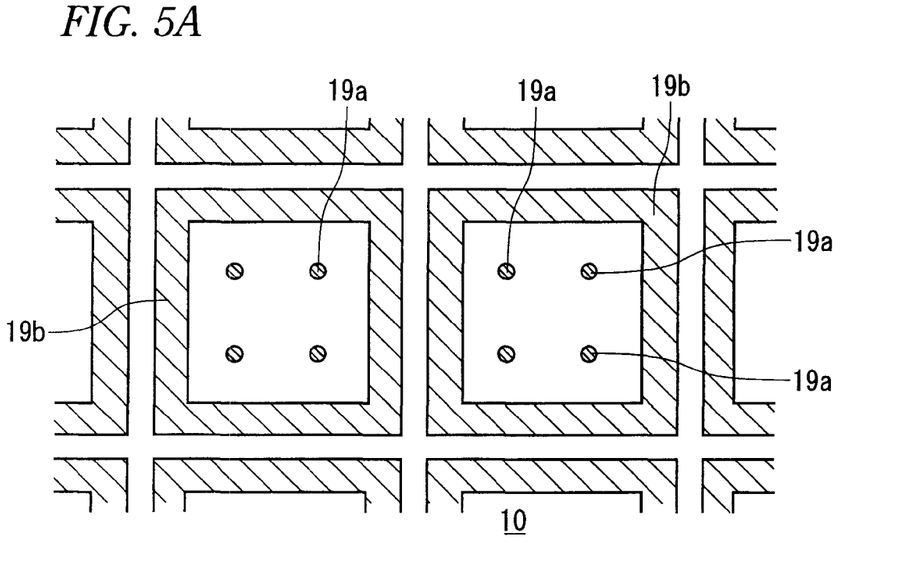
FIGS. 5A and 5B are explanatory views showing steps of manufacturing the semiconductor package according to the second embodiment.

FIG. 5A is a plan view showing a state that the conductive materials 19a and the metal bonding materials 19b are provided on the silicon wafer 10. The conductive material 19a is provided at four locations to meet the edge positions of the vias 13. The metal bonding material 19b is provided like a rectangular frame shape to encircle the area, in which the MEMS element 20 is housed, from the outside. The reason why the planar shape of the metal bonding material 19b is formed like the rectangular frame shape is that such planar shape should be made to fit in with the outer shape of the semiconductor package.

As the conductive material 19a and the metal bonding material 19b, the metal material such as the solder, or the like having the joinability may be employed. As the conductive material 19a and the metal bonding material 19b, either the same metal material may be employed or the different metal material may be employed. In the area of the silicon wafer 10 where the metal bonding material 19b is formed, it is preferable that the underlying layer should be formed like a frame by the plating or the sputtering, and then the metal bonding material 19b should be formed on the underlying layer.

Figure 4B:
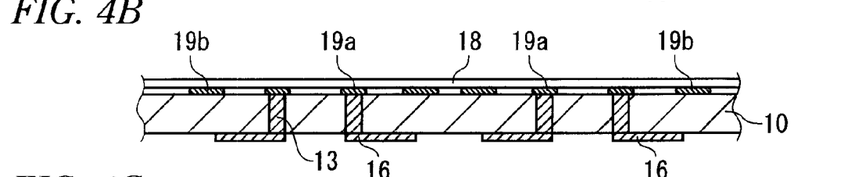

FIG. 4B shows such a state that the MEMS element wafer 18 is aligned with the silicon wafer 10 and is bonded thereto (the step of bonding the MEMS element wafer). When the solder is employed as the conductive material 19a and the metal bonding material 19b, the MEMS element wafer 18 is bonded by the solder reflow. The metal film is formed in advance in the portion of the MEMS element wafer 18 to which the metal bonding material 19b is bonded. The metal film can be formed in a predetermined pattern when the electrodes are formed on the MEMS element. When the indium is employed as the conductive material 19a and the metal bonding material 19b, the MEMS element wafer 18 can be bonded to the silicon wafer 10 by applying the pressure only without the heating, or the like.

Figure 5B:
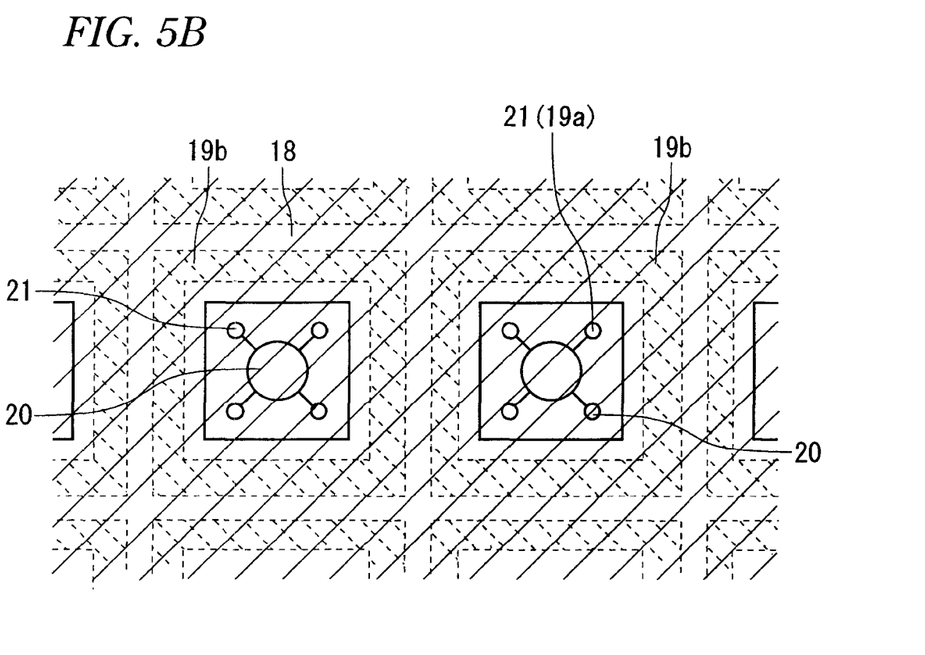

FIG. 5B is a plan view showing a state that the MEMS element wafer 18 is bonded to the silicon wafer 10. The connection electrode 21 of the MEMS element 20 formed on the MEMS element wafer 18 is connected to the via 13 via the conductive material 19a, and the MEMS element wafer 18 is bonded to the silicon wafer 10 via the metal bonding material 19b.

Figure 4C:
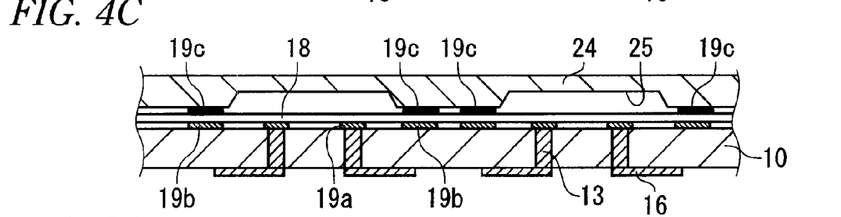

After the MEMS element wafer 18 is bonded, the lid 14 is bonded to the upper surface of the MEMS element wafer 18 (the surface opposite to the surface on which the silicon wafer 10 is bonded) (the step of bonding the lid). The lid 24 is formed like the rectangular planar shape to surround the MEMS element 20 such that such lid 24 does not interfere with the MEMS element 20 formed on the MEMS element wafer 18.

The MEMS element wafer 18 and the lid 24 may be bonded by a resin-based adhesive agent 19c. The adhesive agent 19c is also provided like the rectangular frame planar shape to surround the MEMS element 20 such that the adhesive agent 19c has the same shape as the planar shape of the metal bonding material 19b.

The lid 24 is formed of the silicon wafer, the glass plate, or the like. Since the resin-based adhesive agent 19c does not take account of smoothness of the adhesive surface, this adhesive agent can be used as the bonding method in the situation that the surface of the MEMS element wafer 18 facing the lid 24 is not the smooth surface. Of course, the metal film may be formed on the portion of the MEMS element wafer 18 to which the lid 24 is bonded. When the lid 24 is formed of the silicon wafer, the direct bonding, the eutectic bonding, or the like mentioned above can be used. Also, when the glass plate is used as the lid 24, this lid 24 can be bonded by the anodic bonding.

The operation for bonding the lid 24 can be done in the atmosphere; otherwise the area in which the MEMS element 20 is housed can be sealed in a vacuum when the lid 24 is bonded to the MEMS element wafer 18 in a vacuum environment. The metal bonding material 19b and the adhesive agent 19c are bonded to the silicon wafer 10, the MEMS element wafer 18, and the lid 24 together to surround and seal the area in which the MEMS element 20 is housed on the same plane. Therefore, the MEMS element 20 is sealed by bonding the lid 24 in a vacuum environment.

In FIG. 4C, it appears that the space in which the MEMS element 20 is housed is separated vertically by the MEMS element wafer 18. However, there are many portions that pass through in the thickness direction in the MEMS element wafer 18, and thus the cavities in which the MEMS element 20 is housed respectively are communicated mutually as a whole, so that the cavity in which the MEMS elements 20 are housed is sealed in a vacuum as a whole.

Figure 4D:
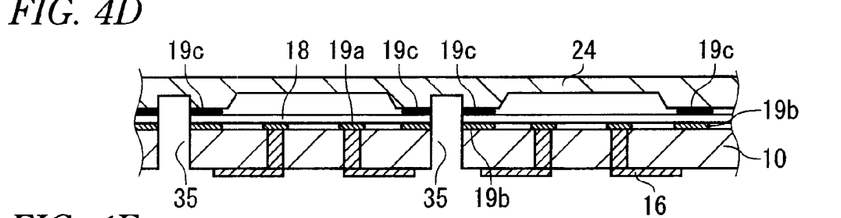

Then, the groove processing is applied from the lower surface side of the silicon wafer 10 to the bonded structure of the silicon wafer 10, the MEMS element wafer 18, and the lid 24 (the step of forming the groove). FIG. 4D shows a state that grooves 35 are formed in the bonded structure by the groove processing.

The groove 35 passes through the silicon wafer 10 and the MEMS element wafer 18 in the thickness direction, and then is provided such that a bottom surface of the groove 35 (inner bottom surface) is positioned in the middle of the lid 24 in the thickness direction. The grooves 35 are provided by the rotary blade processing or the router processing such that they pass through the boundary positions between single semiconductor packages. Since the semiconductor packages are arranged in a matrix fashion, the grooves 35 are also formed in a matrix fashion in the bonded structure.

Also, the grooves 35 are formed such that positions of the outer edges of the metal bonding materials 19b and the adhesive agents 19c intersect with positions of the inner wall surfaces of the grooves 35, i.e., the end edges of the metal bonding materials 19b and the adhesive agents 19c are exposed from the inner wall surfaces of the grooves 35.

Figure 4E:
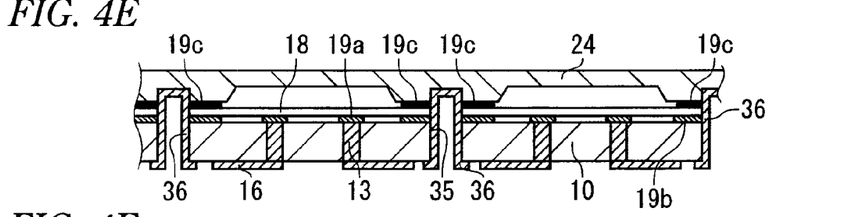

Then, the metal plating is applied to the inner bottom surfaces and the inner wall surfaces of the grooves 35. FIG. 4E shows a state that a metal plating 36 is applied to the inner bottom surfaces and the inner wall surfaces of the grooves 35. The metal plating 36 is provided to cover continuously end surfaces the metal bonding material 19b and the adhesive agent 19c exposed from the inner wall surfaces of the grooves 35 and end surfaces of the silicon wafer 10, the MEMS element wafer 18, and the lid 24. The area in which the MEMS element 20 is housed can be sealed hermetically against the outside without fail by this metal plating. When the inside of the package is sealed in a vacuum, it is effective to ensure hermetic sealing by applying the metal plating.

The metal plating 36 may be applied by the ordinary plating method. For example, a plating seed layer is formed on the lower surface of the bonded structure by the sputtering such that the grooves 35 are exposed and the areas in which the wiring pattern 16 is formed respectively are covered, and then the metal plating 36 can be applied by the electrolytic copper plating while using the plating seed layer as a plating power feeding layer.

Figure 4F:
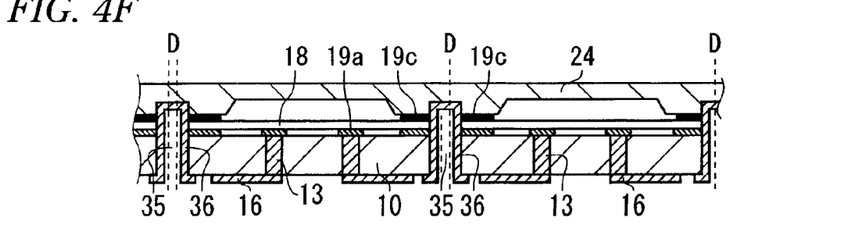

After the metal plating 36 is applied, the semiconductor packages as a single piece are formed by cutting the bonded structure of the MEMS element wafer 18 and the lid 24 into the individual pieces (the cutting step). FIG. 4F shows a state that the bonded structure is cut away into the individual pieces. When the bonded structure is cut away, the positions in which the metal plating 36 deposited on the inner wall surfaces of the grooves 35 is left respectively (the positions indicated with a line D in FIG. 4F) are set as the cutting position on the outer surface of the semiconductor package.

Figure 6A:
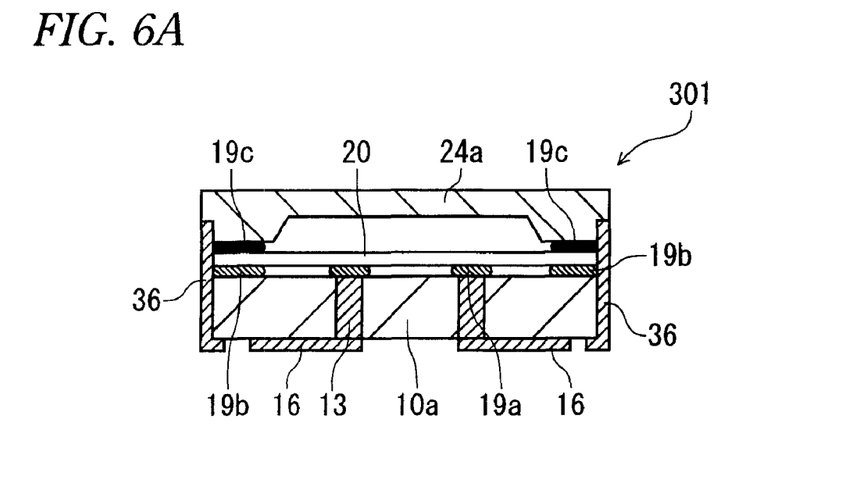
FIG. 6A is a sectional view showing the semiconductor package according to the second embodiment.
Figure 6B:
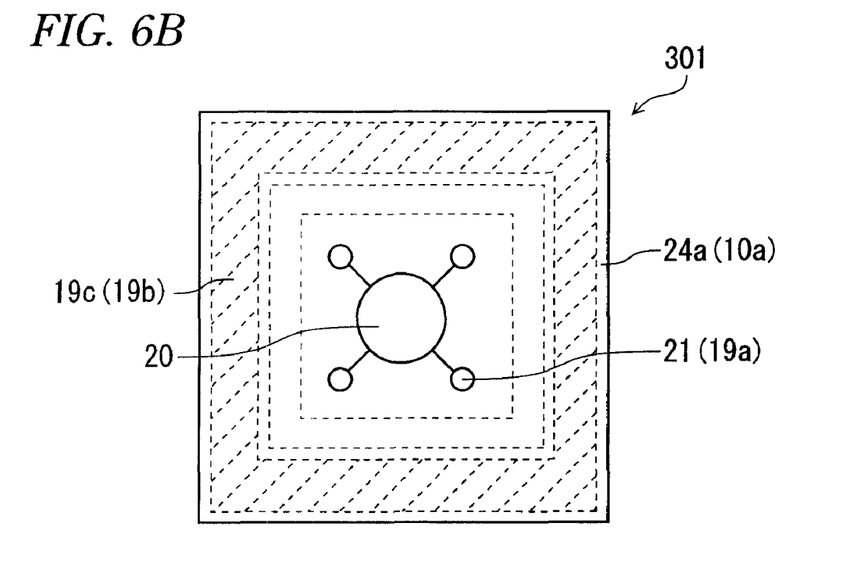
FIG. 6B is a plan view showing the semiconductor package according to the second embodiment.

A sectional view of a semiconductor package 301 formed by the above method is shown in FIG. 6A, and a plan view of this package is shown in FIG. 6B. As shown in FIG. 6A, the semiconductor package 301 is formed such that the first substrate 10a formed of the silicon wafer 10, the MEMS element 20, and the second substrate 24a formed of the lid 24 are stacked in this order, the first substrate 10a and the MEMS element 20 are bonded hermetically via the metal bonding material 19b, and the MEMS element 20 and the second substrate 24a are sealed hermetically via the adhesive agent 19c. The outer peripheral side surfaces of the bonded portion between the first substrate 10a and the MEMS element 20 and the bonded portion between the MEMS element 20 and the second substrate 24a are covered with the metal plating 36, and thus the hermetic sealing can be ensured. When the cavity in which the MEMS element 20 is housed is sealed in a vacuum, reliability of the characteristics of the semiconductor package 301 can be further improved.

FIG. 6B shows a state that the adhesive agent 19c and the metal bonding material 19b are provided to surround the peripheral edge portion of the semiconductor package 301.

In the present embodiment, the grooves 35 are formed and the inner wall surfaces and the inner bottom surfaces of the grooves 35 are covered with the metal plating 36. In this case, when the sealing by the metal bonding material 19b and the adhesive agent 19c can be ensured sufficiently, the semiconductor package can be obtained simply by dicing the bonded structure of the silicon wafer 10, the MEMS element wafer 18, and the lid 24 without machining the grooves 35 and the metal plating 36. For example, when the metal bonding material (described later) is used as the adhesive agent 19c, the sealing property of the MEMS element 20 can be improved, and the semiconductor package can be formed without the groove processing.

(Third Embodiment)

In the second embodiment, there is described the method of vacuum-sealing the MEMS element 20 in the semiconductor package. Especially, there is described the method of bonding the lid 24 to the MEMS element wafer 18 in a vacuum environment. In this third embodiment, there is described another method of sealing and mounting the MEMS element 20 in a vacuum.

Figure 7A:
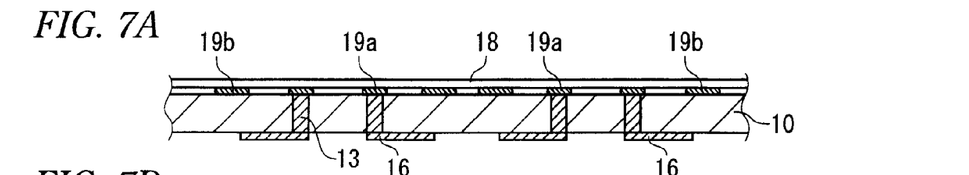
FIGS. 7A to 7F are explanatory views showing steps of manufacturing a semiconductor package according to a third embodiment.

FIG. 7A shows a state that the MEMS element wafer 18 is bonded to the silicon wafer 10 (corresponding to the step in FIG. 4B). A lid 241 is bonded to the MEMS element wafer 18 in FIG. 7B. The method of bonding the lid 241 is similar the method explained in the second embodiment.

Figure 7B:
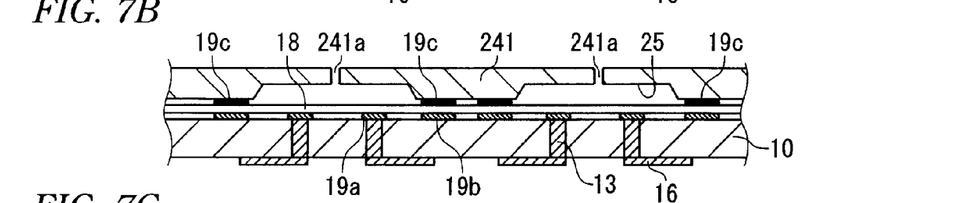

In the third embodiment, the lid 241 has vent holes 241a each formed therethrough and communicating with the concave portion 25. The vent hole 241a is a communicating hole that is provided to vacate the area in which the MEMS element 20 is housed. The vent hole 241a is communicated with the concave portion 25, and a forming position is not particularly limited if the vent hole 241a is formed to open the outer surface of the lid 241.

Because the vent hole 241a is provided in the lid 241, the process of bonding the lid 241 to the MEMS element wafer 18 is performed in the air.

Figure 7C:
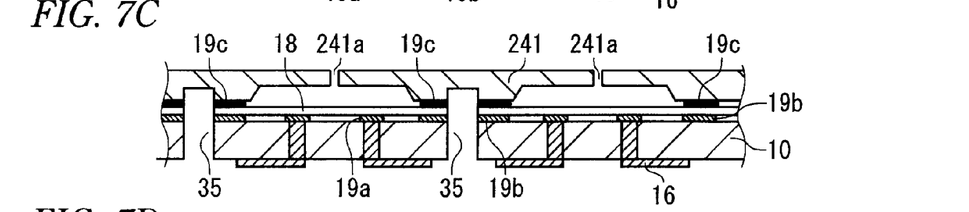
Figure 7D:
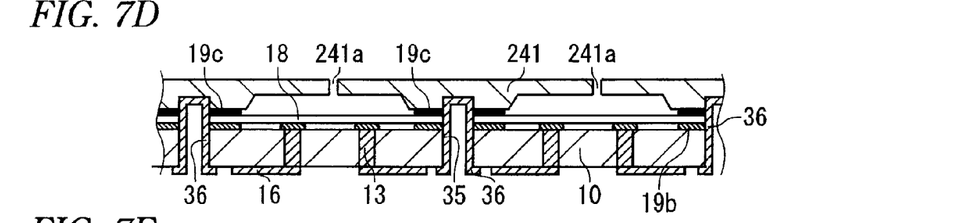

FIG. 7C shows a state that the grooves 35 are formed in the bonded structure of the silicon wafer 10, the MEMS element wafer 18, and the lid 241. FIG. 7D shows a state that the inner wall surfaces and the inner bottom surfaces of the grooves 35 are covered with the metal plating 36. These steps are similar to the steps in FIGS. 4D and 4E.

Figure 7E:
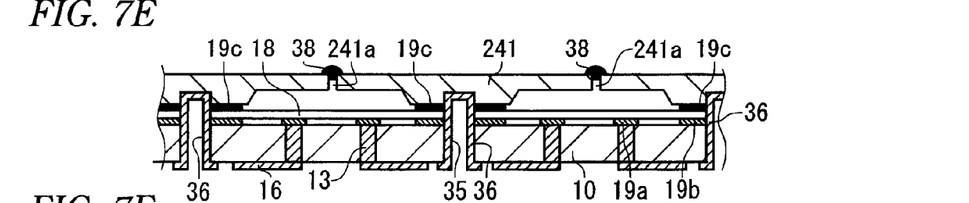

FIG. 7E is a view to explain the vacuum sealing step. In the state shown in FIG. 7D, the bonded structure of the silicon wafer 10, the MEMS element wafer 18, and the lid 241 is placed in a vacuum environment, and then the vent hole 241a is sealed, so that the MEMS element 20 is sealed in a vacuum. For example, a metal ball that can be fused by the heating might be placed on the vent hole 241a, and the metal ball is fused in a vacuum environment to seal the vent hole 241a and is solidified in the atmosphere. FIG. 7E shows a state that the vent hole 241a is sealed by a sealing material 38 and the MEMS element 20 is sealed in a vacuum in the package.

Figure 7F:
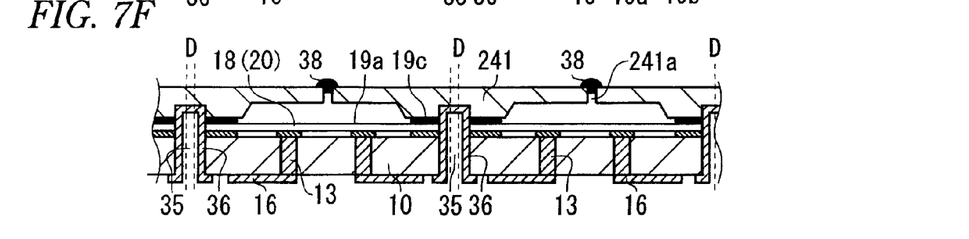

FIG. 7F shows the step of forming the semiconductor package by cutting the bonded structure, in which the MEMS element 20 is sealed in a vacuum, in the cutting positions D into individual pieces (the cutting step).

Figure 8A:
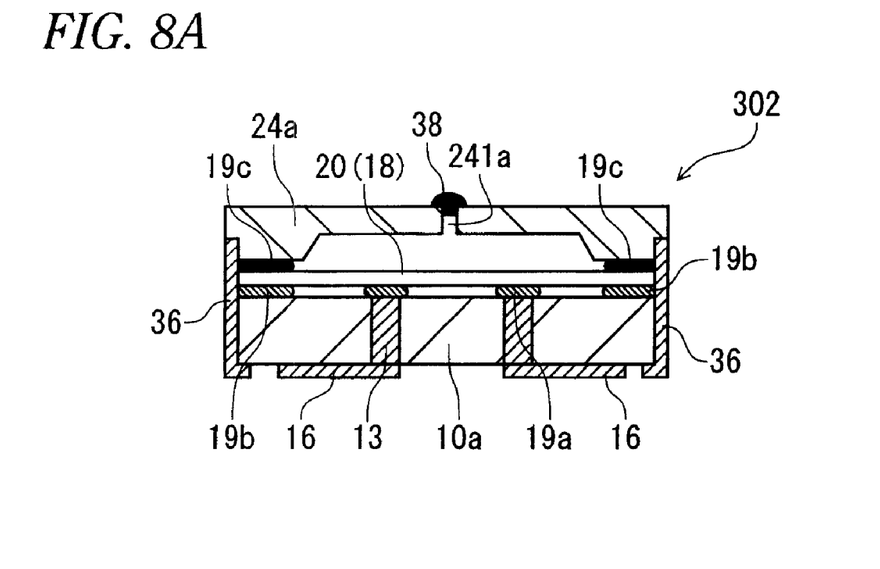
FIG. 8A is a sectional view showing the semiconductor package according to the third embodiment.
Figure 8B:
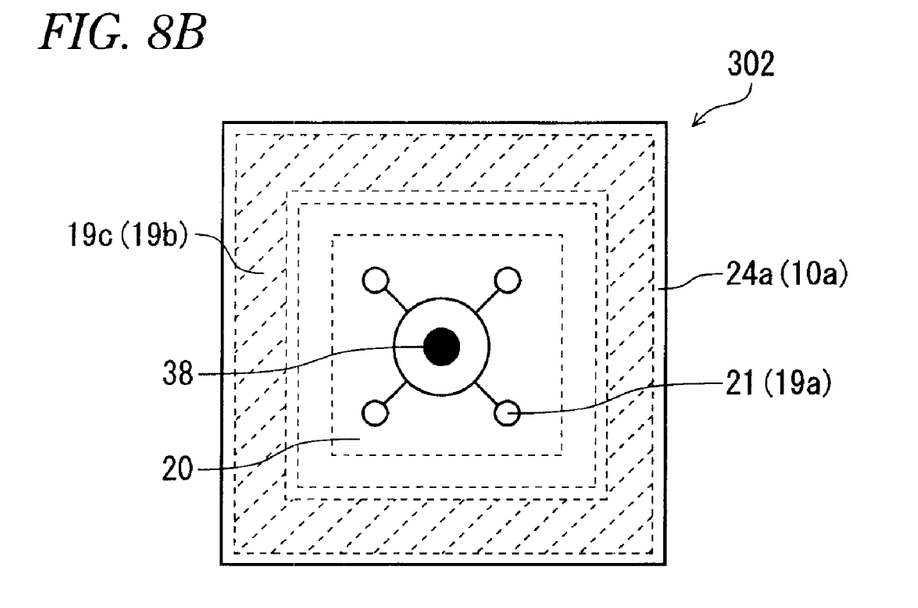
FIG. 8B is a plan view showing the semiconductor package according to the third embodiment.

In FIGS. 8A and 8B, a sectional view and a plan view of a semiconductor package 302 obtained by the above method are shown. The views of the semiconductor package 302 are similar to the semiconductor package 301 shown in FIGS. 6A and 6B. The semiconductor package 302 and the semiconductor package 301 are different from each other in that the vent hole 241a used to vacuate the cavity, in which the MEMS element 20 is housed, is provided in the second substrate 24a formed of the lid 24, and that the vent hole 241a is sealed by the sealing material 38 and the inside of the cavity is sealed in a vacuum.

According to the present embodiment, the silicon wafer 10, the MEMS element wafer 18, and the lid 24 are bonded together, and then the MEMS element 20 is sealed in a vacuum by sealing the vent hole 241a in a vacuum environment. Accordingly, like the second embodiment, in the present embodiment, the vacuum sealing operation can be performed easily without fail rather than the vacuum sealing method that is executed together with the operation of bonding the lid 24 to the MEMS element wafer 18.

Also, in the present embodiment, the lid 241 in which the vent hole 241a is provided is bonded onto the MEMS element wafer 18, then the grooves 35 are formed, and then the metal plating 36 is deposited and formed on the inner wall surfaces and the inner bottom surfaces of the grooves 35. However, in case the MEMS element 20 can be sealed surely by the metal bonding material 19b and the adhesive agent 19c, it is not ncessary to provide the grooves 35 and the metal plating 36.

(Fourth Embodiment)

A method of manufacturing a semiconductor package according to the present embodiment is characterized by the steps that the MEMS element wafer 18 is bonded to the silicon wafer 10 and then the metal layer serving as the underlying layer used to bond the lid 24 is formed on the MEMS element wafer 18 when the lid 24 is bonded to the MEMS element wafer 18.

Figure 9A:
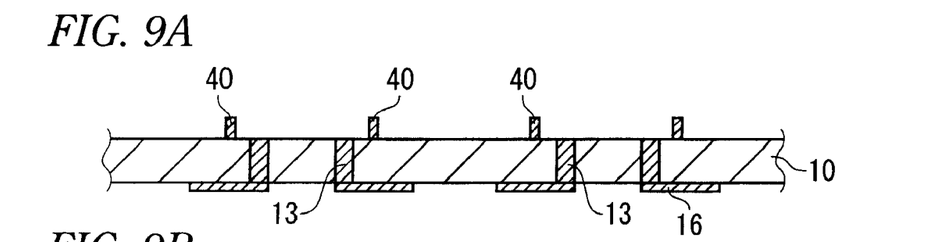
FIGS. 9A to 9E are explanatory views showing steps of manufacturing a semiconductor package according to a fourth embodiment.

FIG. 9A shows a state that posts 40 used for mounting a protection cover are formed on the MEMS element mounting surface of the silicon wafer 10 after the vias 13 and the wiring pattern 16 is formed in and on the silicon wafer 10 respectively. In order to support the protection cover in a floating state from the MEMS element 20, the posts 40 are formed to extend up to a predetermined height from the element mounting surface of the silicon wafer 10.

The posts 40 can be formed using the electrolytic copper plating, or the like. For example, the posts 40 are formed by forming a plating seed layer on the element mounting surface, then covering the plating seed layer with a resist, then forming post holes in the portions where the posts 40 are formed, and then overlaying the plating in the post holes.

Figure 9B:
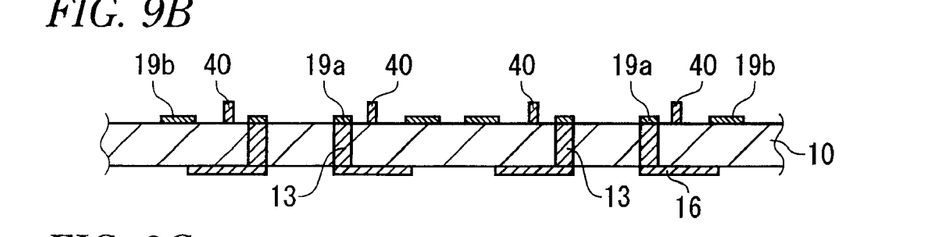

FIG. 9B shows a state that the conductive materials 19a and the metal bonding materials 19b are deposited and formed in a predetermined position on the element mounting surface of the silicon wafer 10 on which the posts 40 are formed.

Figure 11A:
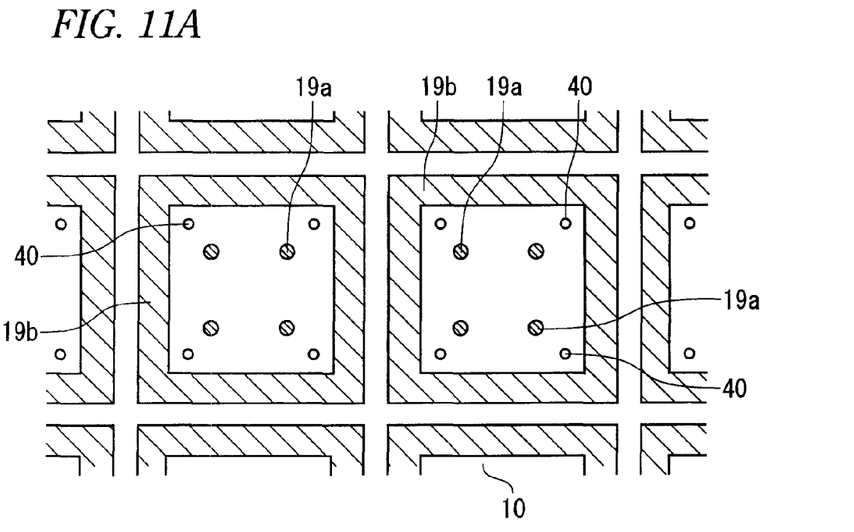
FIG. 11A is a plan view showing an arrangement of posts that are formed on a silicon wafer.

FIG. 11A shows a state that, when viewed from the top, the conductive materials 19a and the metal bonding materials 19b are formed. The conductive materials 19a are deposited and formed on the end surface of the via 13, and the metal bonding materials 19b are formed like a rectangular frame shape. In the present embodiment, four posts 40 are arranged to surround the via 13.

Figure 9C:
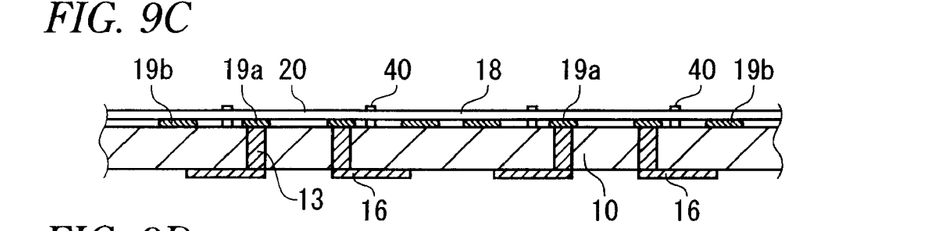

FIG. 9C shows a state that the MEMS element wafer 18 is bonded to the element mounting surface of the silicon wafer 10 (the step of bonding the MEMS element wafer). The MEMS element 20 formed on the MEMS element wafer 18 is bonded to the via 13 via the conductive materials 19a, and the MEMS element wafer 18 is bonded to the silicon wafer 10 via the metal bonding materials 19b. The upper end surfaces (protruded surfaces) of the posts 40 are protruded from the back surface (the upper surface) of the MEMS element wafer 18 such that the MEMS element wafer 18 is bonded to the element mounting surface of the silicon wafer 10. Because many empty portions (clearance portions) are formed in the MEMS element wafer to pass therethrough in the thickness direction, the posts 40 may be formed to coincide with the clearance portions in the MEMS element wafer 18.

Figure 9D:
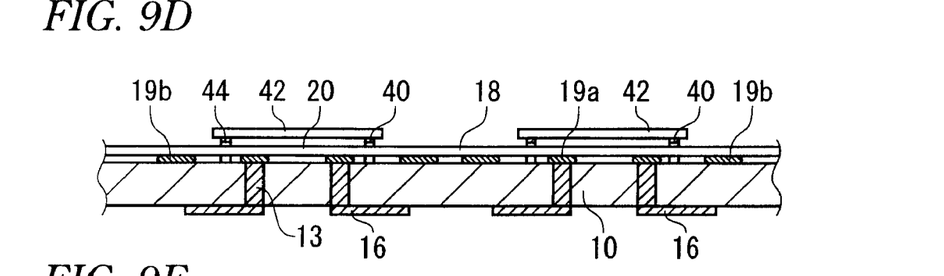

FIG. 9D shows a state that a protection cover 42 is bonded to the posts 40 (the step of bonding the protection cover). In the present embodiment, when viewed from the top, the protection cover 42 is formed like a square shape, and each of the protection cover 42 is supported by the two posts 40. Also, the protection cover 42 is bonded to the posts 40 via bonding materials 44.

Because the upper end surfaces of the posts 40 are located in the higher positions than the back surface of the MEMS element wafer 18, the protection cover 42 can be metallic-bonded without interfering with the MEMS element wafer 18.

Figure 11B:
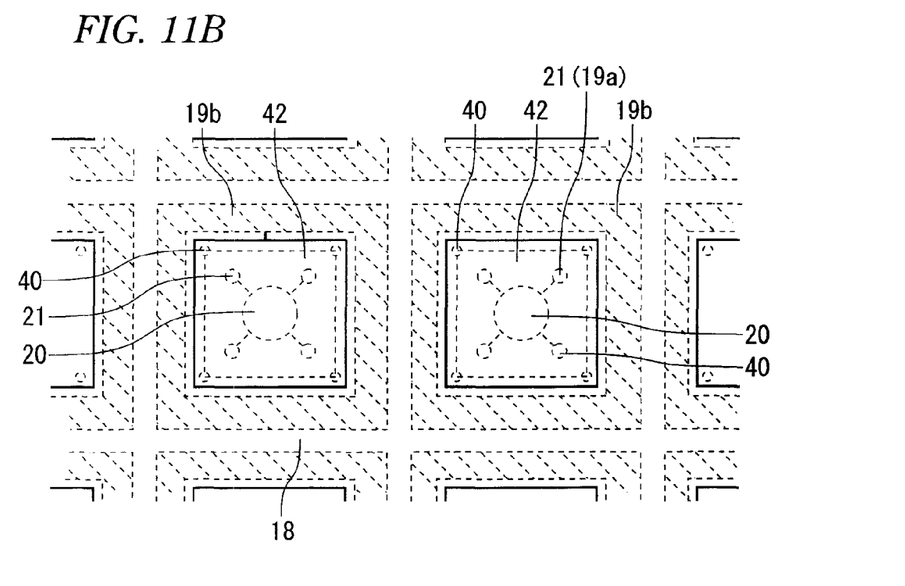
FIG. 11B is a plan view showing a protection cover.

FIG. 11B shows a state that the protection cover 42 is bonded to the posts 40. The protection cover 42 is provided to protect the MEMS element 20 such that the metal layer is not deposited on the MEMS element 20, upon forming the metal layer serving as the underlying layer in the next step. Therefore, a size and a layout of the protection cover 42 are set to cover the area in which the MEMS element 20 is formed.

Figure 9E:
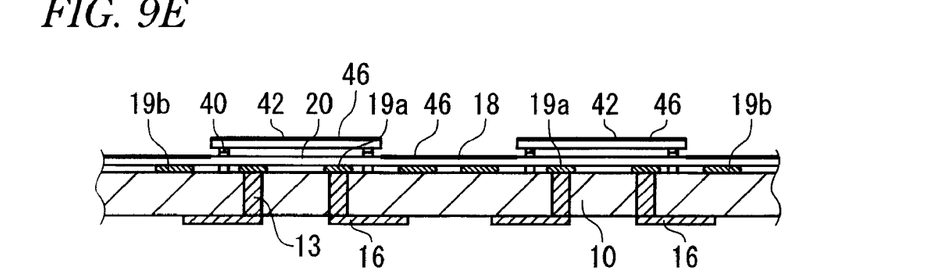

After the protection cover 42 is bonded to the posts 40, a metal layer 46 is deposited and formed on the element mounting surface side of the silicon wafer 10 (see FIG. 9E). The metal layer 46 is formed of a metal such as Cu, Ti, Ni, or the like by the sputtering. In this sputtering step, the area in which the MEMS element 20 is formed is protected by the protection cover 42, and the metal layer 46 is deposited and formed on the outer area that is not shield by the protection cover 42. The outer area of the MEMS element 20 acts as the area to which the lid 24 is bonded. The protection cover 42 is arranged such that the area to which the lid 24 is bonded is exposed, i.e., the metal plating 36 is deposited.

In the step of forming the metal layer 46, the metal layer 46 is formed to enable the protection cover 42 to exhibit the shielding function, e.g., the sputtering method or the vapor deposition method.

Figure 10A:
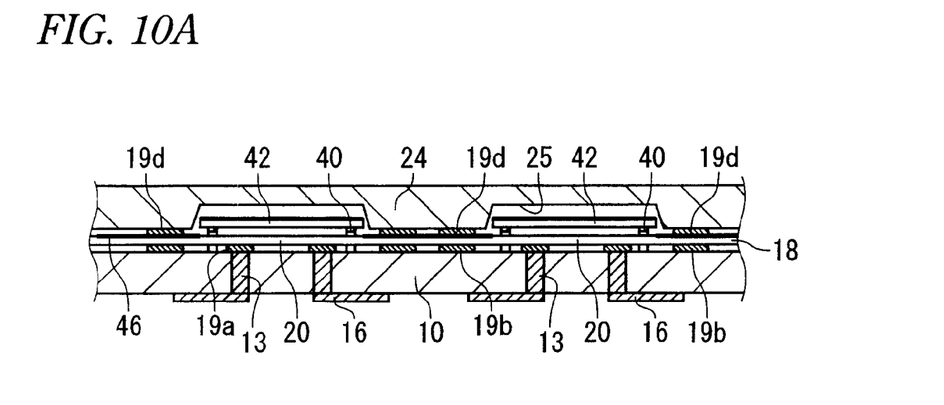
FIGS. 10A to 10C are explanatory views showing steps of manufacturing the semiconductor package according to the fourth embodiment.

FIG. 10A shows a state that the lid 24 having the concave portions 25 therein is bonded to the element mounting surface of the silicon wafer 10 by a metal bonding material 19d while using the metal layer 46 as the underlying layer. The metal bonding material 19d is provided to surround the entire area in which the MEMS element 20 is housed, and is bonded such that the MEMS element 20 is sealed hermetically. Since the lid 24 is bonded via the metal bonding material 19d, the hermetic sealing property of the MEMS element 20 can be improved rather than the case where the lid 24 is bonded by the resin-based adhesive agent, and also the reliability of the semiconductor package mounted with the MEMS element 20 can be improved.

Figure 10B:
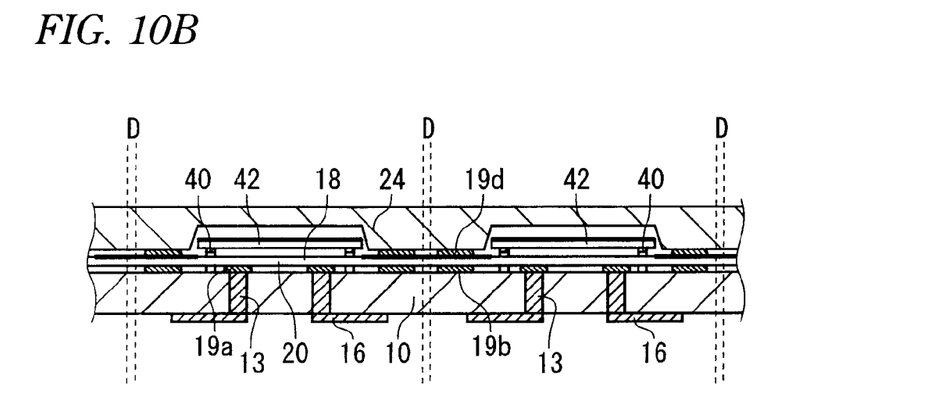

FIG. 10B shows the step of cutting the bonded structure of the silicon wafer 10 and the lid 24 into individual semiconductor packages (the cutting position D). Because the sealing property of the metal bonding materials 19b, 19d is excellent, it is not necessary to machine the grooves 35 or form the metal plating 36, unlike the second embodiment and the third embodiment.

Figure 10C:
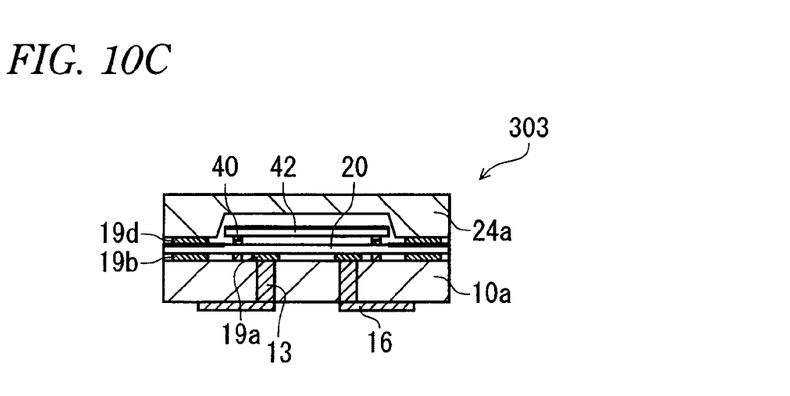

FIG. 10C shows a sectional view of a semiconductor package 303 that is divided into one individual piece. In the semiconductor package 303, the MEMS element 20 is sealed hermetically in the package when the first substrate 10a and the second substrate 24a are bonded via the metal bonding materials 19b, 19d to place the MEMS element 20 in the thickness direction between them. Since the protection cover 42 is arranged to cover the upper surface of the MEMS element 20, the semiconductor package can be assembled such that the metal layer is not adhered to the MEMS element 20.

In the second embodiment or the third embodiment, when the lid is bonded by the metal bonding, the method of shielding the MEMS element 20 by the protection cover 42 may be used, as in the present embodiment. In the present embodiment, the grooves 35 are formed in the bonded structure of the silicon wafer 10 and the lid 24, but the step of applying the metal plating 36 is not employed. However, in the present embodiment, both the groove processing and the metal plating may be applied, as in the second and third embodiments.

Also, the present invention has been described in connection with the manufacture method of the semiconductor package mounted with the MEMS element 20. However, the present invention is not limited the semiconductor package mounted with the MEMS element 20. The present invention can be applied to the semiconductor package such as LED or laser diode (LD), which requires sealing process. In this case, LED, LD or the like is formed in a wafer and this wafer is handled like the MEMS element wafer. Thus, as described in the present embodiment, the semiconductor package mounted with these elements can be obtained.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A semiconductor package, comprising:
   a first substrate comprising a first surface and a second surface opposite to the first surface;
   a wiring pattern on the first surface of the first substrate;

a MEMS element comprising an electrical connection region and a bonding region surrounding the electrical connection region, wherein the MEMS element is electrically connected to the wiring pattern in the electrical connection region, and the MEMS element is bonded on the second surface of the first substrate through a first bonding material in the bonding region;

a second substrate having a concave portion therein and being bonded on the MEMS element through a second bonding material so as to hermetically seal the MEMS element, wherein the second bonding material is provided in the bonding region of the MEMS element; and a metal film formed on the first and second bonding materials, a side surface of the MEMS element, a side surface of the first substrate and a side surface of the second substrate.

* * * * *